(12) United States Patent
Newman (10) Patent No.: US 7,456,356 B2
(45) Date of Patent: Nov. 25, 2008

(54) SHELF GROUNDING DEVICE FOR REDUCING ELECTROSTATIC DISCHARGE RISK

(76) Inventor: Scott Newman, 14990 SW. Carolwood Dr., Beaverton, OR (US) 97007

( * ) Notice: Subject to any disclaimer, the term of this patent is extended or adjusted under 35 U.S.C. 154(b) by 591 days.

(21) Appl. No.: 10/539,464

(22) PCT Filed: Dec. 31, 2003

(86) PCT No.: PCT/US03/41779
§ 371 (c)(1),
(2), (4) Date: Jun. 21, 2005

(87) PCT Pub. No.: WO2004/064217
PCT Pub. Date: Jul. 29, 2004

(65) Prior Publication Data
US 2006/0021776 A1 Feb. 2, 2006

Related U.S. Application Data

(60) Provisional application No. 60/439,165, filed on Jan. 9, 2003.

(51) Int. Cl.
*H05K 5/02* (2006.01)

(52) U.S. Cl. .............. 174/51; 174/40 CC; 174/6; 174/135; 439/98; 361/799

(58) Field of Classification Search .......... 174/51, 174/40 CC, 135, 6, 53, 35 R; 439/98, 92, 439/95, 108, 97; 361/799, 800, 753
See application file for complete search history.

(56) References Cited

U.S. PATENT DOCUMENTS

| 4,012,578 A | | 3/1977 | Moran et al. |
| 6,106,310 A | * | 8/2000 | Davis et al. ............ 439/95 |
| 6,304,457 B1 | | 10/2001 | Liu et al. |
| 6,986,673 B2 | * | 1/2006 | de la Borbolla ........ 439/100 |

* cited by examiner

*Primary Examiner*—Dhiru R Patel
(74) *Attorney, Agent, or Firm*—Hancock Hughey LLP (57) ABSTRACT

A grounding clip is a shelf-grounding device includes a resilient conductive clip that installs onto a fully assembled shelving unit, providing a plurality of electrical connections between the shelf and post to reduce the risks from electrostatic discharge, or ESD. The clip can be installed and removed without the use of tools and is held securely in place when attached. Since the clip is attached after the shelving unit is assembled, less skill is required by the installer during the installation or reconfiguration process. The clip is reusable and provides electrical connectivity between the shelf and post regardless of whether the shelving unit was assembled with conductive or plastic split sleeves.

18 Claims, 5 Drawing Sheets

SHELF GROUNDING DEVICE FOR REDUCING ELECTROSTATIC DISCHARGE RISK

FIELD OF THE INVENTION

This invention relates to electrostatic discharge ("ESD") and in particular, the grounding of shelving and transport carts with apparatus and methods used to reduce risk of damage from electrostatic discharge for electronic circuits and other areas where electrostatic discharge may cause hazards.

BACKGROUND

Conventional shelving units typically include a plurality of vertically standing support posts and at least one shelf horizontally supported by the posts. For example, U.S. Pat. No. 3,523,508, issued to Maslow 1972, and No. 3,757,705, issued to Maslow 1970, disclose a shelving unit formed from four support posts, and one or more horizontal shelves provided with a frustro-conically shaped collar at each corner for receiving one of the support posts. A split sleeve is secured to each support post and fits into the frustro-conically shaped collar at each corner of the shelf. The positions of the split sleeves on the support posts are vertically adjustable so the height and relative spacing of the horizontal shelves can be chosen when assembling the shelving structure. These adjustable shelving structures are sold and marketed under the trademark SUPER ERECTA SHELF by InterMetro Industries Corporation, of Wilkes-Barre, Pa. Other similar adjustable shelving structures are offered under brand names such as EAGLE and others.

Static electricity is commonly defined as an electrical charge resulting from the imbalance of electrons on the surface of a material. Most people are quite familiar with the everyday effects of static electricity—it is the shock one receives when touching a doorknob after walking across a carpet. The technical name for the electrical shock just described is electrostatic discharge. ESD is technically described as the transfer of electrical charge between bodies—for instance, a human hand and a doorknob—that are at different electrical potentials.

In most everyday situations, ESD can be a bother but rarely a problem. However, the problems resulting from ESD are magnified in industrial settings, where ESD is a major concern. Among the many problems that static discharge can cause are the unintentional ignition of flammable materials, damage to electronic components and systems, and the attraction of contaminants such as charged dust particles in clean room environments. Even centuries ago military forces were aware that ESD could cause the unintentional ignition of black powder. To alleviate this sometimes-catastrophic problem, ESD control measures were used as early as the 14th century to protect black powder stores. Today, many industries—from high tech manufacturing plants to businesses commonly thought of as "smoke stack" industries—are concerned with ESD and its control, since controlling ESD can lead to a safer work environment and reduction or elimination of damage resulting from ESD.

While nearly all industries are or should be concerned with controlling ESD, the concern is most acutely felt by businesses in the electronics industry. To give just a few examples of the damage that ESD can cause in the electronics industry, it can destroy or degrade semiconductor devices by changing operational characteristics. It can cause disruptions to the normal operation of an electronic system—sometimes leading to equipment failure, and in clean rooms it can cause charged particles to adhere tightly to the surface of a silicon wafer, resulting in distinct problems with wafer production and efficiency.

Given these problems and the economic damage that can result from them, control of ESD is a major concern and a complete industry has grown up around the field of ESD control.

Some very common ESD protective measures are to use conductive floors, benches, containers, storage shelves, and transport carts, and then connect each of these, as well as products and people, to a common electrical ground. Connecting them to a common electrical ground reduces any build-up of electrical potential between objects, thereby reducing the risk of an ESD event.

A critical component of an ESD control program is dissipating and neutralizing ESD during handling, transporting and storing of ESD sensitive materials.

With respect to shelving units there is a real need therefore for an easier method of providing ESD safety.

SUMMARY

This device is a clip that easily installs onto a fully assembled shelving unit, without the use of tools, and provides electrical connection between the shelf and post to reduce the risks from electrostatic discharge, or ESD.

This device is a resilient electrically conductive clip that quickly and easily attaches externally to the shelf and the post, rather than internally as does the split sleeve that is the currently available solution. This clip installs to a shelving unit and is held in place by the resiliency of the material, but is easily removed and reused if the configuration of the shelving unit changes. Each clip provides a plurality of electrical contact points to both the shelf and post to assure electrical connection and can be installed or removed without tools and without disassembling the shelving unit.

Besides the objects and advantages of the electrically conductive metal split sleeves described in the above patent, several objects and advantages of the present invention are:

Easy to retrofit shelving units that are already assembled;

Can be installed without any disassembly of the shelving unit;

Can be installed and removed without the use of tools;

Attaches externally to the post and shelf, rather than attaching by means of wedging the split sleeve in-between the shelf collar and post;

Provides a visual indication that the shelf is electrically connected to a post, unlike the metal split sleeve which is mostly hidden from view when it is installed Reduced errors and rework during shelving unit assembly or modifications because grounding clips are attached after assembly rather than during the assembly process;

Provides a plurality of points of contact between the shelf and post.

BRIEF DESCRIPTION OF THE DRAWINGS

FIG. 12-A is a partial perspective view of a first alternative embodiment of the illustrated invention mounted in the standard position to a conventional adjustable shelving unit.

FIG. 12-B is a perspective view of the first alternative embodiment of the present invention shown in FIG. 12-A.

FIG. 13-A is a partial perspective view of a second alternative embodiment of the illustrated invention mounted in the standard position to a conventional adjustable shelving unit.

FIG. 13-B is a perspective view of the second alternative embodiment of the present invention shown in FIG. 13-A.

DETAILED DESCRIPTION

Description of the Prior Art

Figures 1, 2, 3:
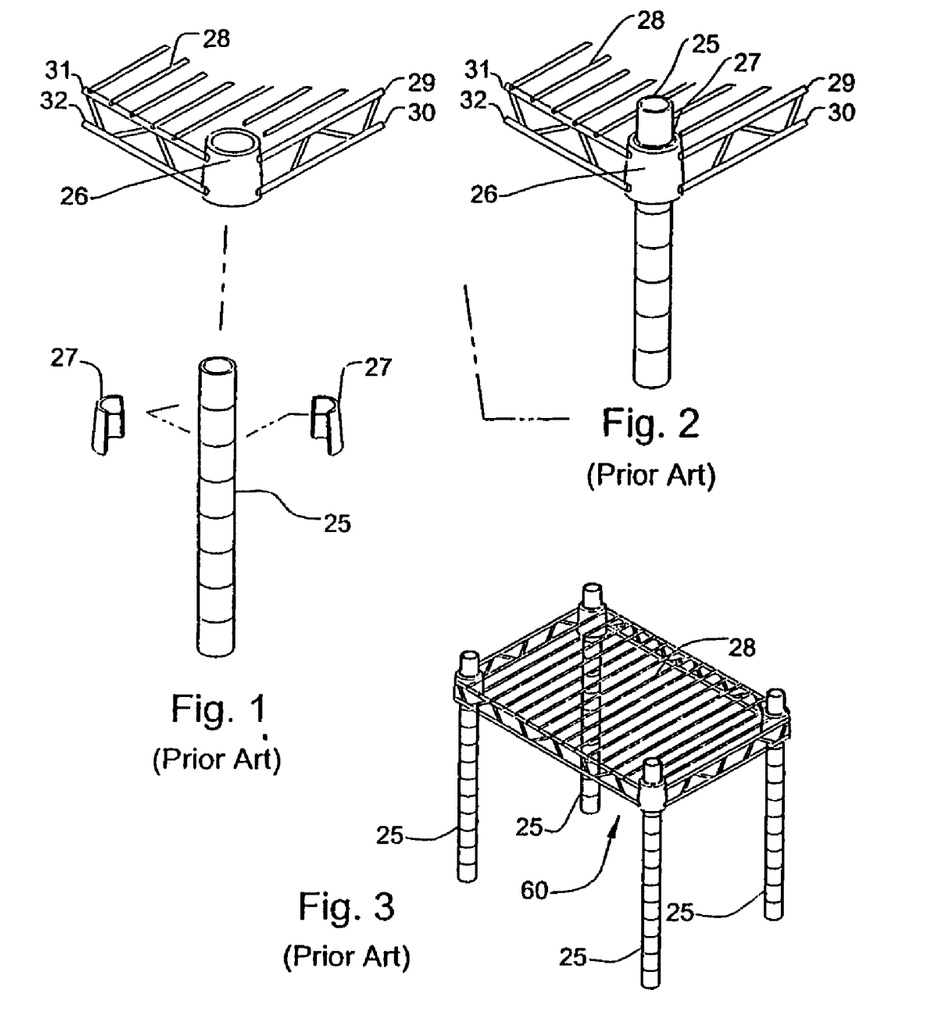
FIG. 1 is a partial perspective of an exploded view showing one corner of the conventional shelving unit according to the prior art and as shown in FIG. 3.
FIG. 2 is a partial perspective view showing one corner of the prior art shelving structure shown in FIG. 3.
FIG. 3 is a perspective view of portion of a prior art adjustable shelving unit.

FIGS. 1 through 3 show in detail a conventional adjustable shelving unit 60 of the type disclosed in U.S. Pat. No. 3,757,705 and as known in the art. A formed-wire shelf 28 has a frustro-conically shaped shelf collar 26 at each corner for receiving a support post 25. The wire shelf is defined by a plurality of longitudinally extending wire shelf members 31 and 32 and a plurality of transversely extending wire members 29 and 30, all welded, and therefore electrically connected, to one another at their respective intersecting points to form a rigid structure.

A common type of shelving unit and transport cart used in the electronics and other industries is a type of wire shelving shown in FIG. 1 through FIG. 3 and discussed in the Description of Prior Art. One reason for its popularity is that both the shelves 28 and posts 25 are metal, and therefore conductive, allowing them to be electrically connected, providing a means to connect the shelving and therefore the material stored on the shelves to a common ground. Another reason for their popularity is that the shelves can be adjusted to various spacing.

Shelving units such as those in FIG. 1 through FIG. 3 (hereafter referred to as shelving units) are typically shipped with split sleeves 27 that are made out of an insulative petroleum based material, hereafter referred to as plastic, although metal (or other conductive material) split sleeves 27 can be special ordered, at additional cost, to electrically connect the metal shelves 28 to the metal posts 25. If assembled correctly, the shelving units can then be grounded to a common ground using wire, conductive feet, or conductive wheels.

Where ESD is a concern, the minimum configuration required to electrically connect all shelves to a common ground is to pick one corner post of a shelving unit as a ground post and then install one metal split sleeve 27 on the same corner of each shelf 28, connecting one corner of each shelf to the selected ground post 25. The selected ground post 25 is then typically connected to the common ground using a conductive foot, wheel, or wire. In an effort to reduce costs, it is a common practice to use only one metal split sleeve 27 per shelf rather than install them on multiple corners of each shelf.

A common problem occurs when shelving units are assembled incorrectly, using plastic split sleeves 27 instead of metal, or installing metal split sleeves 27 in the wrong locations, effectively insulating one or more shelves 28 from the posts 25 and therefore not providing an ESD safe solution.

In addition to causing ESD risk when a shelving unit is initially assembled, of each time it is reconfigured, there is a high probability that the split metal sleeves 27 will be installed incorrectly, rendering one or more shelves 28 non-ESD safe.

To make a misassembled shelving unit ESD safe, it must be disassembled and all plastic sleeves must be replaced with metal sleeves on at least one post 25. The disassembly/reassembly process typically requires unloading the shelves, tipping the shelving unit on its side, hammering it apart, replacing plastic sleeves with metal sleeves, reassembling the shelving unit, and then reloading the shelves.

Although some of the newer shelving unit designs are easier to disassemble, the replacement process still requires unloading, partially disassembling, reassembling, and then reloading of the shelves.

Replacing the split sleeves is difficult due to the frusto-conical design of the shelving collar and split sleeves. Essentially the more weight that the shelf has had on it and the more settling the shelf has done over time, the more difficult it is to disassemble. Since the split sleeves are tapered, covered, and wedged into the space between the shelf collar 26 and the post 25 when they are assembled, the split sleeves are not easily moved from one location to another.

Other solutions have been installed in the field, such as 1) installing wires with screws and clamps to electrically connect one shelf to another and 2) drilling a hole through the shelf collar 26 and into the post 25 and driving a screw into the hole. Both of these solutions are effective, but both methods are inflexible and labor-intensive. Drilling a hole and driving a screw into the post 25 often results in a broken drill bit or screw, resulting in a shelf 28 that is no longer adjustable until the broken drill bit or screw is removed. Another potential problem with drilling holes and driving screws into them is that it leaves the shelves and posts with holes that will not align if a shelf location is changed.

While using the metal split sleeves 27 does provide a sufficient electrical connection between a shelf 28 and post 25, they are difficult to install after a shelving unit 60 has already been assembled and are difficult and time consuming to move if they were installed in the wrong location. They are also mostly hidden from view when installed, not making it obvious whether they were correctly installed.

Description of a First Preferred Embodiment of the Illustrated Invention

Figure 4:
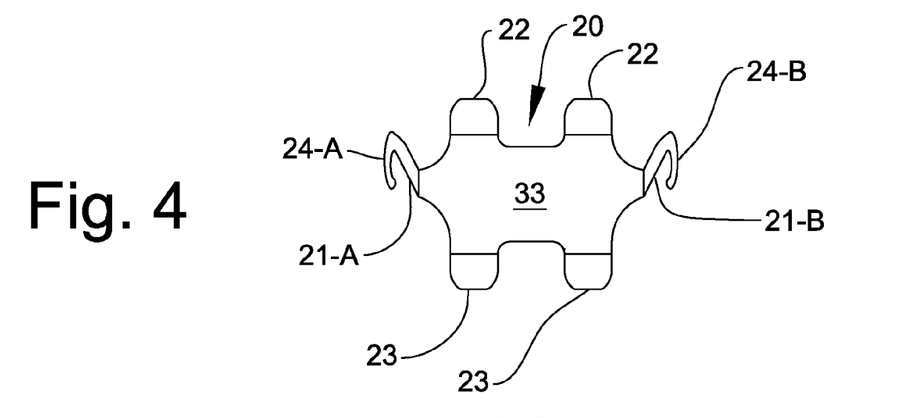
FIG. 4 Shows front perspective view of one illustrated embodiment of the clip according to the present invention.
Figure 5:
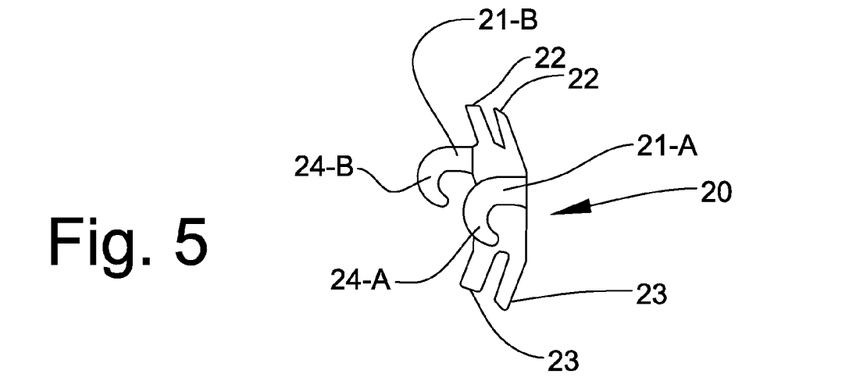
FIG. 5 is a left-rear perspective view of the clip shown in FIG. 4.
Figure 6:
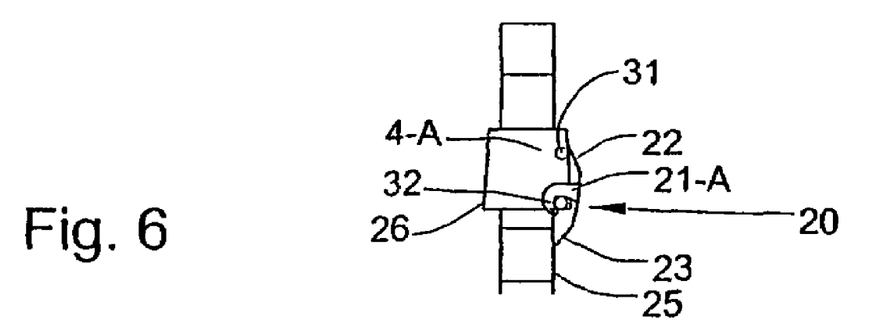
FIG. 6 is a partial left view of the clip shown in FIG. 4 mounted in the lower position to a conventional adjustable shelving unit.

A first preferred embodiment of the wire shelf ESD connecting clip 20 is shown in FIGS. 4 through 11. Clip 20 includes a main body portion 33 having two upward extending members, upper contacts 22, two downward extending members, lower contacts 23, and two forward extending members, left hook arm 21-A and right hook arm 21-B, one extending from each lateral side of clip 20. Hook arms 21-A and 21-B also have a downward hook formed on each of their ends, left hook 24-A and right hook 24-B. Upward extending members 22 and downward extending members 23 also angle forward as shown in FIG. 5 and FIG. 6.

Clip 20 is made of any sufficiently strong, electrically conductive, resilient, corrosion resistant, and flexible material such as a spring steel, hardened stainless steel, or conductive plastic material.

Figure 7:
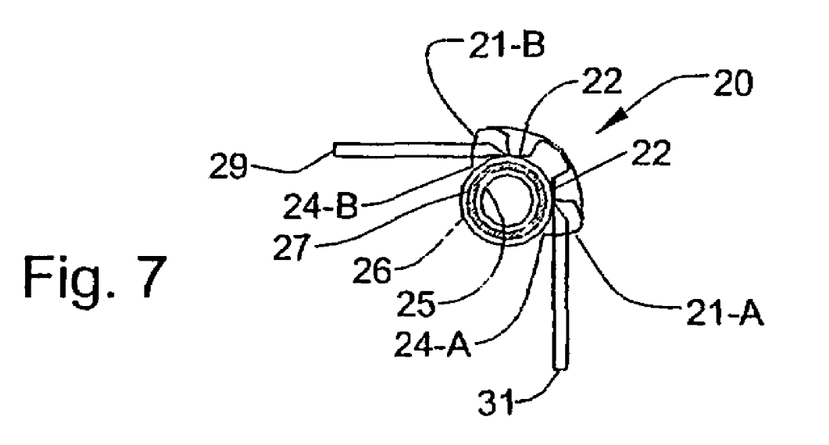
FIG. 7 is a partial top view of the clip according to the embodiment of the present invention illustrated in FIG. 4, mounted in the lower position to a conventional adjustable shelving unit.
Figure 8:
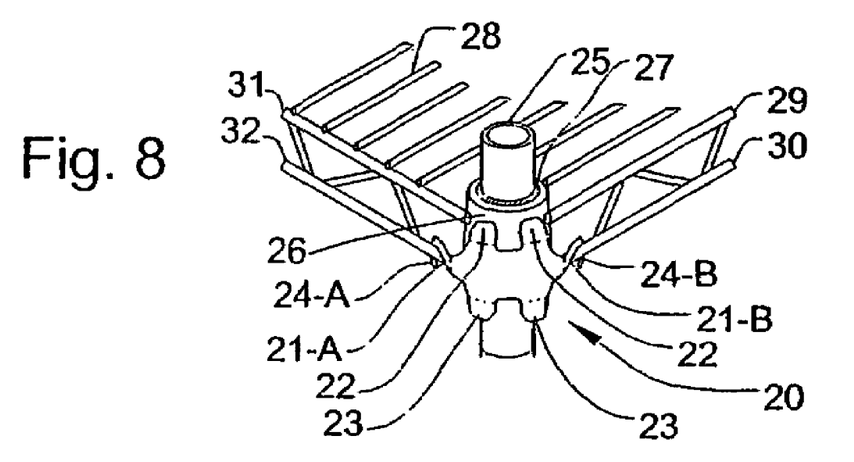
FIG. 8 is a partial perspective view of the clip according to the embodiment of the present invention illustrated in FIG. 4, mounted in the lower position to a conventional adjustable shelving unit.

Clip 20 is typically installed in one of two positions. In the lower position, as shown in FIGS. 6, 7, and 8, the left hook 24-A is hooked on the lower longitudinally extending member 32 and right hook 24-B is hooked on the lower transversely extending member 30. As attached, the two upper contacts 22 are compressed against the shelf collar 26 and the lower two contacts 23 are compressed against the post 25. The two upper contacts 22, and the left and right hooks 24-A and 24-B are making mechanical and electrical connection to various parts of the shelf 28 (specifically at lower longitudinally extending member 32 and lower transversely extending member 30). The lower contacts 23 are making mechanical and electrical contact with the post 25, providing multiple electrical connections between the shelf 28 and the post 25.

Figure 9:
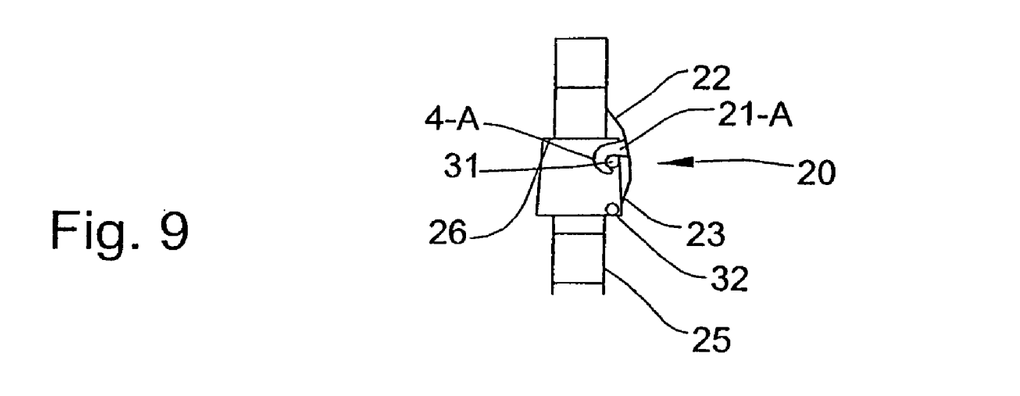
FIG. 9 is a partial left view of the clip of FIG. 4 mounted in the upper position to a conventional adjustable shelving unit.
Figure 10:
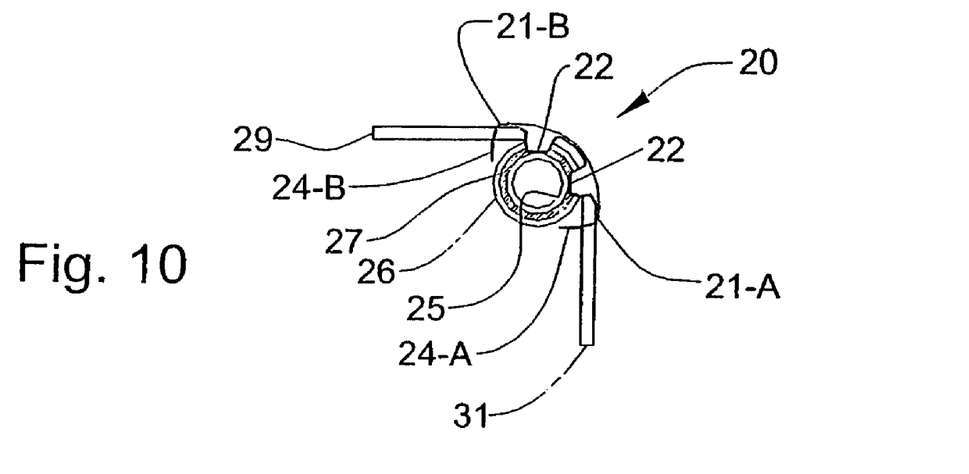
FIG. 10 is a partial top view of the clip of FIG. 4 mounted in the upper position to a conventional adjustable shelving unit.
Figure 11:
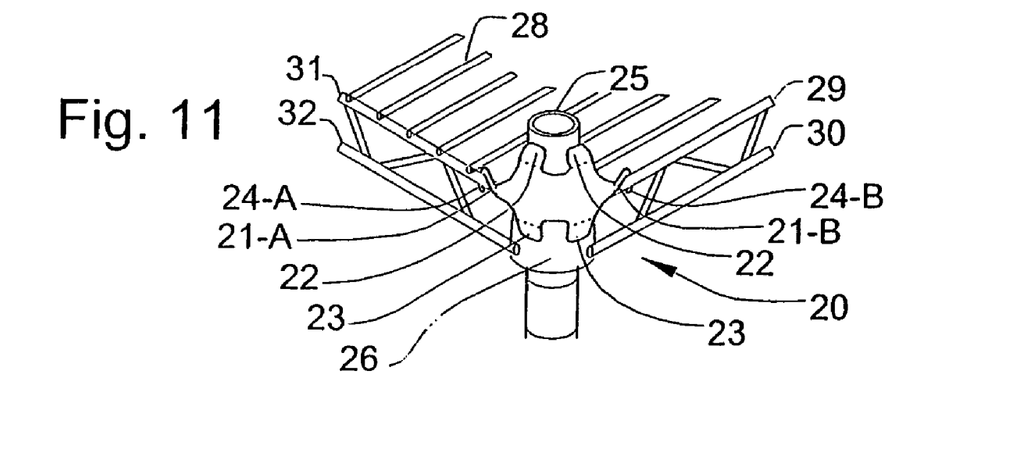
FIG. 11 is a partial perspective view of the clip illustrated in FIG. 4 mounted in the upper position to a conventional adjustable shelving unit.

With clip 20 installed in the upper position, as shown in FIGS. 9, 10 and 11, the left hook 24-A is hooked on the upper longitudinally extending member 31 and right hook 24-B is hooked on the lower transversely extending member 29. As attached, the two upper contacts 22 are compressed against the post 25 and the lower two contacts 23 are compressed against the shelf collar 26. The two lower contacts 23, and the left and right hooks 24-A and 24-B are making mechanical and electrical connection to various parts of the shelf 28 (specifically at upper longitudinally extending member 31 and upper transversely extending member 29). The lower contacts 23 are making mechanical and electrical contact with the post 25, providing multiple electrical connections between the shelf 28 and the post 25.

With the clip 20 installed in either the upper or lower position, resilient upper and lower contacts 22 and 23 are compressed and therefore exert force in the opposite direction against the resilient force of the left hook arm 21-A and right hook arm 21-B. Left and right hook arms 21-A and 21-B pull the left and right hooks 24-A and 24-B back, and force upper contacts 22 and lower contacts 23 against the shelf collar 26 and post 25, hold the clip in place and promote good electrical and mechanical contacts.

With clip 20 installed in either the upper or lower position, resilient left and right hook arms 21-A and 21-B pull the left and right hooks 24-A and 24-B back, hold clip 20 in place and force clip 20 forward. The force holding clip 20 also forces upper and lower contacts 22 and 23 against the shelf collar 26 and post 25 and improves the reliability of the electrical connections.

The design of clip 20 uses an efficient one-piece design that attaches to an assembled shelving unit using 2 hooks 24-A and 24-B to hold 2 upper and 2 lower contacts 22 and 23 to provide multiple points of electrical contact between the surface of the shelf 28 and post 25.

Operation of the First Illustrated Embodiment of FIGS. 1-11

Operation of the clip 20 in the normal position as shown in FIG. 6 through FIG. 8 is described below. Operation in the upper position is identical to the lower position except that the left and right hooks are connected to the upper members 29 and 31.

In operation, a shelving unit is assembled or an existing shelving unit is modified to its desired configuration using either plastic or metal split sleeves 27 to support the shelves 28. One uses the clips 20 of the present invention according to the following steps:

To install a clip 20:

1) pick one or more corner posts 25 of a shelving unit 60 to serve as a ground post;

2) install one clip 20 to each shelf 28 on the corner or corners selected as the ground post(s) 25 as follows:

a) grasp the clip by the left and right hook arms 21-A and 21-B with the hooks pointing down;

b) squeeze left and right hook arms 21-A and 21-B together to form the main body portion 33 of the clip 20 so that it curves around the shelf collar 26 (as best shown in FIG. 7);

c) connect the left hook 24-A over member 32 and connect right hook over member 30;

d) confirm that upper and lower contacts 22 and 23 are being forced against the shelf sleeve 26 and the post 25; and    e) Check electrical continuity between the shelf 28 and post 25 using an ohmmeter.

To remove a clip 20:

1) grasp the clip by the left and right hook arms 21-A and 21-B;

2) squeeze left and right hook arms 21-A and 21-B together while pressing the clip 20 toward the shelf collar 26;

3) lift clip 20 upward to disengage the left hook 24-A from member 32 and right hook from member 30; and 4) remove clip 20

Description of a Second Illustrated Embodiment

Figure 12:
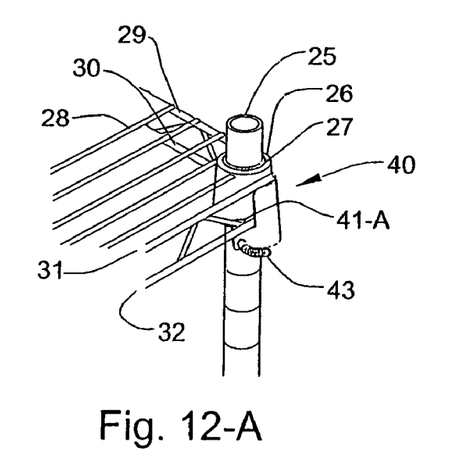

A second illustrated, alternative embodiment of a wire shelf ESD connecting clip 40 according to the present invention is illustrated in FIG. 12-A and 12-B. Clip 40 is similar to clip 20 described in detail above, except that clip 40 can be made from a less resilient material than clip 20. A material such as non-hardened stainless steel, aluminum, conductive plastic, or other similar material, will do, as spring 43 provides most of the resiliency to hold clip 40 in place and assure electrical contact. Clip 40 is defined by a main body portion 47, left and right retaining hooks 41-A and 41-B, and spring 42. Clip 40 makes electrical and mechanical contact with the post 25 by way of spring 43. Clip 40 makes contact to the shelf 28 by means of left retaining hook 41-A and right retaining hook 41-B to engage members 30 and 32. Hooks 41-A and 41-B are held against member 30 and 32 by means of the force from spring 43 against post 25.

Clip 40 can also be inverted and installed with hooks 41-A and 41-B connected on the upper frame members 29 and 31. This is optional can be used as needed to accommodate specific shelving unit configurations.

Operation of the Second Illustrated Embodiment

This operation describes operation of clip 40 in the normal position as shown in FIG. 12-A and 12-B. Operation in the inverted position is nearly identical except that the left and right hooks 41-A and 41-B are connected to the upper members 29 and 31, and one presses down to engage hooks 41-A and 41-B rather than up.

First, assemble a shelving unit or modify an existing shelving unit to its desired configuration using either plastic or metal split sleeves 27 to support the shelves 28. In operation, one uses the clip 40 as follows:

To install a clip 40:

1) pick one or more corner posts of a shelving unit 60 to serve as a ground post;

2) install one clip 40 to each shelf 28 on the corner(s) selected as ground posts 25 as follows:

a) grasp the clip with hooks 41-A and 41-B pointing up as in FIG. 12-B;

b) bring clip 40 toward the post 25 with spring 43 just below shelf collar 26 and hooks 41-A and 41-B just under members 30 and 32;

c) press the main body of clip 40 toward the shelf collar 26, which stretches spring 43 around post 25;

d) press upwards on clip 40 to engage left hook 41-A over member 32 and right hook 41-B over member 30.

3) Check electrical continuity between the shelf and post 25 using an ohmmeter.

To remove a clip 40:

1) grasp the clip 40 by the main body;

2) press clip 40 toward the shelf collar 26;

3) lower clip to disengage the hooks 41-A and 41-B from members 32 and member 30; and 4) remove clip 40.

Description of a Third Illustrated Embodiment

Figure 13:
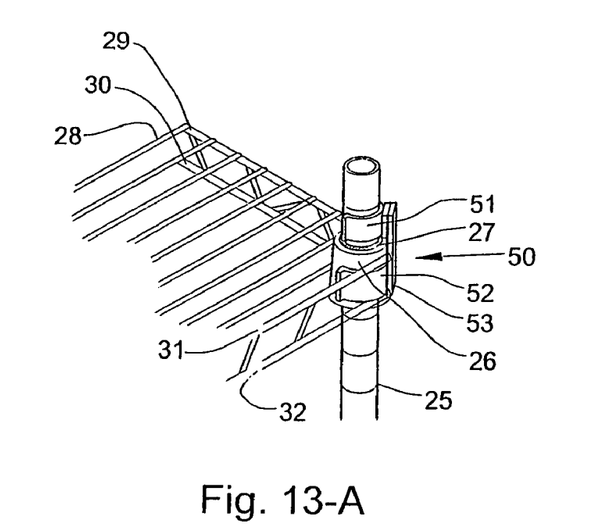

A third illustrated, alternate embodiment of a wire shelf ESD connecting clip according to the present invention is illustrated in FIG. 13-A and 13-B as clip 50. Clip 50 is similar to clip 20 described in detail above, except that clip 50 utilizes two resilient C-shaped clips 51 and 52 connected with a conductive backing that defines a main body portion 53 of clip 50. C-shaped clips 51 and 52 must have adequate resiliency and flexibility to accommodate the post 25 and the larger size of the shelf collar 26, or one c-shaped clip 51 or 52 can be made larger than the other to accommodate the larger shelf collar 26.

Clip 50 can also be inverted and installed with c-shaped clip 51 attached to post 25 below shelf 28 rather than above and c-shaped clip 52 attached to the shelf collar. This inverted installation is optional and can be used as needed to accommodate specific shelving unit configurations.

Operation of the Third Illustrated Embodiment

This operation describes operation of the clip 50 in the normal position as shown in FIG. 13-A and 13-B. Operation in the inverted position is nearly identical except that the upper c-shaped clip 51 is connected to the post 25 below the shelf collar rather than above it. C-shaped clip 52 is installed in the same location over shelf collar 26, but the entire clip 50 is inverted.

First, assemble a shelving unit or modify an existing shelving unit to its desired configuration using either plastic or metal split sleeves 27 to support the shelves 28. In operation, one uses the clip 50 as follows:

To install a clip 50:

1) pick one or more corner posts of a shelving unit to serve as a ground post;

2) install one clip 50 to each shelf on the corner or corners selected with the ground post 25 of the shelving unit 60 as follows:

a) grasp clip 50 with the c-shaped clip 51 on top and the open portion of the clips pointed toward the post 25 and shelf sleeve 26 as in FIG. 13-B;

b) bring clip 50 toward post 25 and shelf collar 26 with c-shaped clip 52 engaging shelf collar 26 at a vertical height of approximately half-way between upper members 29 and 31 and lower members 30 and 32 and c-shaped clip 51 engaging post 25 just above shelf collar 26;

c) press the main body of clip 50 toward the shelf collar 26 and post 25 until c-shaped clips 51 and 52 snap firmly into place over shelf collar 26 and post 25.

3) Check electrical continuity between the shelf 28 and post 25 using an ohmmeter.

To remove a clip 50:

1) grasp the clip 50 by the main body;

2) pull clip 50 away from the shelf collar 26 and post 25; and 3) remove the clip 50.

Based on the foregoing description and the drawings it will be apparent that the various embodiments of clips comprise several structural elements that have functional purposes. These include for example post contact means for establishing an electrically conductive path from the post 25 to the main body of the clip (e. g., contacts 23 in FIGS. 6-8; contacts 22 in FIGS. 9-11; spring 43 in FIGS. 12-A and 12-B; and clip 51 in FIGS. 13-A and 13-B), shelf contact means electrically connected to the main body of the clip for establishing an electrically conductive path from the shelf to the clip (e. g., hook arms 21-A and 21-B in FIGS. 4-11; hooks 41-A and 41-B in FIGS. 12-A and 12-B; and clip 52 in FIGS. 13-A and 13-B), and retaining means for retaining the post contact means in electrical contact with the shelf (e. g., the resilient main body portion 33 and contacts 22 and 23 in FIGS. 4-11; spring 43 in FIGS. 12-A and 12-B; and clip 51 and 52 in Figs. 13-A and 13-B).

Having here described illustrated embodiments of the invention, it is anticipated that other modifications may be made thereto within the scope of the invention by those of ordinary skill in the art. It will thus be appreciated and understood that the spirit and scope of the invention is not limited to those embodiments, but extend to the various modifications and equivalents as defined in the appended claims.

I claim:

1. A clip for establishing an electrical interconnection between a shelf and a post in a shelving unit of the type having an electrically conductive shelf and an electrically conductive post, said shelf including a sleeve that couples to said post, said clip comprising:

a main body having a first electrically conductive portion configured for making contact with a shelf, and a second electrically conductive portion configured for making contact with a post to thereby establish an electrically conductive path between said shelf and said post, said first electrically conductive portion defined by first and second opposed arms having outer ends configured for making contact with the shelf, and said second electrically conductive portion defined by at least one upwardly extending contact member for making electrical contact with either the sleeve or post, and at least one downwardly extending contact member for making electrical contact with either the sleeve or post.

2. The clip according to claim 1 wherein the main body further comprises an electrically conductive resilient member.

3. The clip according to claim 2 wherein the main body further comprises at least one contact member configured for making an electrical contact with said post, and at least one contact member configured for making an electrical contact with said shelf.

4. The clip according to claim 1 wherein the first and second opposed arms define a retaining member for retaining the clip in a position on the shelving unit such that an electrically conductive path is established from the shelf to the post through the clip.

5. The clip according to claim 4 fabricated from a resilient material.

6. The clip according to claim 1 having two upwardly extending contact members, each configured for making contact with the sleeve.

7. The clip according to claim 6 having two downwardly extending contact members, each configured for making contact with the post.

8. The clip according to claim 1 having two upwardly extending contact members, two downwardly extending contact members, and two retaining members defined by the opposed arms, and wherein the outer ends of the opposed arms have hooks formed thereon.

9. The clip according to claim 1 including a spring to urge said first electrically conductive member into mechanical and electrical contact with said shelf, and to urge said second electrically conductive member into mechanical and electrical contact with said post, said spring establishing an electrically conductive path from said shelf to said post.

10. An electrically conductive clip for making electrical contact between a shelf and a post, comprising:
a main body portion having a first contact portion defined by a first hook arm and a second hook arm, each hook arm adapted for contacting the shelf, a second contact portion between the first and second hook arms, said second contact portion having a first contact area for making contact with the shelf and a second contact area for making contact with the post, wherein the first and second hook arms define a retainer for retaining the clip in a desired position relative to the shelf and post, and wherein said first and second contact positions and said retainer are electrically connected to said main body portion.

11. The electrically conductive clip according to claim 10 wherein the shelf and a post are in a shelving unit of the type having an electrically conductive shelf and an electrically conductive post, wherein said second contact portion is configured for making mechanical and electrical contact with said post and said first and second hook arms are configured for making mechanical and electrical contact with said shelf, and said retainer is configured for maintaining said second contact portion and said first and second hook arms in mechanical and electrical contact with said post and shelf, respectively.

12. The electrically conductive clip according to claim 11 wherein said main body portion comprises a resilient material.

13. The electrically conductive clip according to claim 12 wherein said main body portion, and said first and second hook arms define a unitary member.

14. A clip for establishing an electrical interconnection between a shelf and a post in a shelving unit of the type having an electrically conductive shelf and an electrically conductive post, said clip comprising:
an electrically conductive main body, said main body further comprising:
post contact means for establishing an electrically conductive path from said post to said main body;
shelf contact means electrically connected to said main body for establishing an electrically conductive path from said shelf to said main body;
retaining means for retaining said post contact means in electrical contact with said post and said shelf contact means in electrical contact with said shelf and to thereby maintain an electrically conductive path from said shelf through said main body and to said post.

15. The clip according to claim 14 including a plurality of post contact means, each for establishing a separate electrically conductive path from said post to said main body.

16. The clip according to claim 15 including a plurality of shelf contact means, each for establishing a separate electrically conductive path from said shelf to said main body.

17. The clip according to claim 16 wherein the retaining means further comprises a pair of hook arms extending from said main body, each of said hook arms configured for connection with said shelf.

18. The clip according to claim 14 wherein the retaining means further comprises a pair of resilient C-shaped clips, one of said C-shaped clips configured for connecting to said post and the other of said C-shaped clips configured for connecting to said shelf.

* * * * *